United States Patent
Lv et al.

(10) Patent No.: US 11,398,590 B2
(45) Date of Patent: Jul. 26, 2022

(54) DETECTION SUBSTRATE, PREPARATION METHOD THEREOF, DETECTION DEVICE AND DETECTION METHOD

(71) Applicant: BOE Technology Group Co., Ltd., Beijing (CN)

(72) Inventors: Zhijun Lv, Beijing (CN); Liwen Dong, Beijing (CN); Xiaoxin Song, Beijing (CN); Feng Zhang, Beijing (CN); Zhao Cui, Beijing (CN); Wenqu Liu, Beijing (CN); Detian Meng, Beijing (CN); Libo Wang, Beijing (CN)

(73) Assignee: BOE Technology Group Co, Ltd., Beijing (CN)

( * ) Notice: Subject to any disclaimer, the term of this patent is extended or adjusted under 35 U.S.C. 154(b) by 91 days.

(21) Appl. No.: 16/925,300

(22) Filed: Jul. 9, 2020

(65) Prior Publication Data
US 2021/0091281 A1 Mar. 25, 2021

(30) Foreign Application Priority Data

Sep. 24, 2019 (CN) .......................... 201910905291.1

(51) Int. Cl.
*H01L 33/62* (2010.01)
*H01L 33/00* (2010.01)
(Continued)

(52) U.S. Cl.
CPC .............. *H01L 33/62* (2013.01); *H01L 22/34* (2013.01); *H01L 27/156* (2013.01);
(Continued)

(58) Field of Classification Search
CPC . H01L 33/62; H01L 33/0093; H01L 33/0095; H01L 33/36; H01L 33/52;
(Continued)

(56) References Cited

U.S. PATENT DOCUMENTS

| 2005/0017708 A1 | 1/2005 | Miller et al. |
| 2011/0186899 A1 | 8/2011 | van Lieshout |

(Continued)

FOREIGN PATENT DOCUMENTS

| CN | 1816751 A | 8/2006 |
| CN | 102742010 A | 10/2012 |

(Continued)

OTHER PUBLICATIONS

Office Action dated Nov. 4, 2020 for Chinese Patent Application No. 201910905291.1 and English Translation.

*Primary Examiner* — Igwe U Anya
(74) *Attorney, Agent, or Firm* — Ling Wu; Stephen Yang; Ling and Yang Intellectual Property

(57) ABSTRACT

A detection substrate, a preparation method thereof, a detection device and a detection method are provided. A detection substrate includes a base substrate, wherein the base substrate includes multiple through holes, and electrode columns are embedded in the multiple through holes; the base substrate comprises a detection region and a bonding pad region, the detection region includes a driving circuit, and the bonding pad region is provided with bonding pads; and the bonding pads are connected with the electrode columns through the driving circuit.

17 Claims, 5 Drawing Sheets

(51) Int. Cl.
  *H01L 21/66*  (2006.01)
  *H01L 27/15*  (2006.01)
  *H01L 33/36*  (2010.01)
  *H01L 33/52*  (2010.01)

(52) U.S. Cl.
  CPC ...... *H01L 33/0093* (2020.05); *H01L 33/0095* (2013.01); *H01L 33/36* (2013.01); *H01L 33/52* (2013.01); *H01L 2933/005* (2013.01); *H01L 2933/0016* (2013.01)

(58) Field of Classification Search
  CPC ................... H01L 27/156; H01L 22/34; H01L 2933/0016; H01L 2933/005
  USPC ........................................................ 257/79
  See application file for complete search history.

(56) References Cited

U.S. PATENT DOCUMENTS

| | | | |
|---|---|---|---|
| 2014/0063887 A1* | 3/2014 | Vogelsang | G11C 5/063 365/51 |
| 2014/0197409 A1 | 7/2014 | Partsch | |
| 2015/0187642 A1* | 7/2015 | Batra | H01L 25/0657 257/774 |
| 2019/0011484 A1* | 1/2019 | Pagani | G01R 1/07342 |

FOREIGN PATENT DOCUMENTS

| | | |
|---|---|---|
| JP | 2006-275579 A | 10/2006 |
| JP | 2007-5490 A | 1/2007 |
| JP | 2011-7597 A | 1/2011 |
| TW | 200952107 A1 | 12/2009 |

* cited by examiner

DETECTION SUBSTRATE, PREPARATION METHOD THEREOF, DETECTION DEVICE AND DETECTION METHOD

CROSS-REFERENCE TO RELATED APPLICATION

This application claims the priority of Chinese Patent Application No. 201910905291.1 filed to the CNIPA on Sep. 24, 2019, the content of which is hereby incorporated by reference.

TECHNICAL FIELD

The disclosure relates to, but is not limited to, the technical field of display, in particular to a detection substrate for mass detection of light emitting diodes, a preparation method thereof, a detection device and a detection method.

BACKGROUND

Light Emitting Diode (LED) technology has developed for nearly 30 years, from the initial solid-state lighting power supply to backlight source in the display field, and then to the LED display screen, and the LED is characterized by small volume, high brightness and low energy consumption, etc. The development of the LED technology provides a solid foundation for its wide applications. With development of chip manufacturing and encapsulation technology, Mini Light Emitting Diode (Mini LED) display with dimension of about 100 microns and Micro Light Emitting Diode (Micro LED) display with dimension of less than 50 microns have gradually become a hot spot in the display panel. In an exemplary embodiment, the Micro LED display has obvious advantages such as low power consumption, high color gamut, ultra-high resolution, ultra-thin, and is expected to become a better display technology to replace Organic Light Emitting Diode (OLED) display.

SUMMARY

The following is a summary of the subject matter described in detail herein. This summary is not intended to limit the protection scope of the claims.

A detection substrate includes a base substrate, the base substrate includes multiple through holes, and electrode columns are embedded in the multiple through holes; the base substrate includes a detection region and a bonding pad region, the detection region includes a driving circuit, and the bonding pad region is provided with bonding pads; and the bonding pads are connected with the electrode columns through the driving circuit.

In an exemplary embodiment, the base substrate includes a first surface and a second surface opposite to the first surface, the electrode columns protrude from the first surface and the second surface respectively, forming first contacts on the first surface and second contacts on the second surface.

In an exemplary embodiment, a conductive adhesive layer is provided on the first surface, and the conductive adhesive layer includes multiple conductive adhesive blocks covering the first contacts.

In an exemplary embodiment, the bonding pads and the driving circuit are provided on the second surface, and the bonding pads are connected with the second contacts of the electrode columns through the driving circuit.

In an exemplary embodiment, the driving circuit includes multiple gate lines and multiple data lines connected with the bonding pads, the multiple gate lines and the multiple data lines vertically intersect to define multiple test units, at least one of the multiple test units is provided with a thin film transistor, a gate electrode of the thin film transistor is connected with the gate line, a first electrode of the thin film transistor is connected with the data line, and a second electrode of the thin film transistor is connected with the second contact of the electrode column.

In an exemplary embodiment, the driving circuit includes connection lines, one end of the connection line is connected with the bonding pad, and the other end of the connection line is connected with the second contact of the electrode column.

In an exemplary embodiment, the second surface of the base substrate is further provided with an encapsulation layer covering the driving circuit and the second contacts.

In an exemplary embodiment, a seed layer is provided on a side wall of each of the multiple through holes, the seed layer has tubular structure, the electrode column has column structure provided in the seed layer, and an outer surface of the electrode column is closely attached to an inner surface of the seed layer.

In an exemplary embodiment, the material of the seed layer is the same as that of the electrode column.

A method for preparing a detection substrate includes: providing a base substrate including multiple through holes, wherein the base substrate includes a detection region and a bonding pad region; forming electrode columns in the multiple through holes; and forming a driving circuit in the detection region, and forming bonding pads in the bonding pad region, wherein the bonding pads are connected with the electrode columns by the driving circuit.

In an exemplary embodiment, forming the electrode columns in the multiple through holes includes: depositing a metal thin film on the base substrate with the multiple through holes, and patterning the metal thin film by a patterning process to form a seed layer on a side wall of each of the multiple through holes; and forming the electrode columns in the multiple through holes by an electroplating process; wherein the electrode columns protrude from a first surface and a second surface of the base substrate respectively, forming first contacts on the first surface and second contacts on the second surface; the second surface is a surface opposite to the first surface.

In an exemplary embodiment, depositing the metal thin film on the base substrate with the multiple through holes, and patterning the metal thin film by a patterning process to form the seed layer on the side wall of each of the multiple through holes includes: providing the base substrate on a machine platform, depositing a metal thin film on the first surface of the base substrate, to form the metal thin film on the first surface of the base substrate, on the side walls of the multiple through holes and on the machine platform at a bottom of the multiple through holes; patterning the metal thin film by a patterning process, removing the metal thin film on the first surface and retaining the metal thin film on the side wall of each of the multiple through holes; and removing the base substrate from the machine platform to form the seed layer on the side wall of each of the multiple through holes, wherein the seed layer has tubular structure.

In an exemplary embodiment, the material of the seed layer is the same as that of the electrode column.

A detection device includes: a carrier substrate, configured to carry the detection substrate as described above; a transfer apparatus, configured to transfer multiple elements to be detected to the detection substrate, wherein pins of the elements to be detected are in direct contact with conductive adhesive blocks of the detection substrate; and a control mechanism, electrically connected with bonding pads of the detection substrate and configured to provide electrical signals to the elements to be detected.

In an exemplary embodiment, the elements to be detected are light emitting diodes; the detection device further includes an automated optical inspection apparatus, configured to collect images of multiple light emitting diodes, generate a lighting mapping, and determine unlit light emitting diodes through the lighting mapping.

In an exemplary embodiment, the light emitting diodes include Mini light emitting diodes or micro light emitting diodes.

A detection method includes: providing the detection substrate as described above on a carrier substrate, wherein bonding pads of the detection substrate are electrically connected with a control mechanism; transferring, by a transfer apparatus, multiple elements to be detected to the detection substrate, wherein pins of the multiple elements to be detected are in direct contact with conductive adhesive blocks of the detection substrate; and providing, by the control mechanism, an electrical signals to the elements to be detected.

In an exemplary embodiment, the elements to be detected are light emitting diodes; the detection method further includes: collecting, by an automated optical inspection apparatus, images of multiple light emitting diodes, generating a lighting mapping, and determining unlit light emitting diodes through the lighting mapping.

In an exemplary embodiment, the light emitting diodes include Mini light emitting diodes or micro light emitting diodes.

Other aspects will become apparent upon reading and understanding the drawings and detailed description.

BRIEF DESCRIPTION OF DRAWINGS

Accompanying drawings are used to provide a further understanding of technical solutions of the present disclosure, form a part of the specification, and explain technical solutions of the present disclosure together with embodiments of the present disclosure, while they do not constitute a limitation on the technical solutions of the present disclosure. Shapes and sizes of the components in the drawings do not reflect true proportions, and the purpose is only for schematically describing contents of the present disclosure.

Illustration of reference signs:
10—Base Substrate, 11—First Surface, 12—Second Surface, 20—Seed Layer, 30—Electrode Column, 31—First contact, 32—Second contact, 40—Protective layer, 41—Conductive Adhesive Block, 51—Driving Circuit, 52—Bonding pad, 53—Encapsulation Layer, 100—Carrier Substrate, 200—Detection substrate, 300—External Detection Device, 400—Transfer Apparatus, 401—Transfer plate, 402—Transport head, 403—Controller, 500—Light Emitting element, 501—pin.

DETAILED DESCRIPTION

The mass transfer technology is to transfer a large number (about tens of thousands to hundreds of thousands) of Micro/Mini LEDs onto the driving circuit board to form an LED array, while the mass detection technology is to detect the Micro/Mini LEDs before the mass transfer. A mass detection method is to perform only an appearance detection on the plane and 3D morphology of Micro/Mini LEDs, so as to eliminate Micro/Mini LEDs with defects such as bad cracks.

It was found that although the Micro/Mini LEDs with appearance defects can be eliminated by the mass detection, the Micro/Mini LEDs with qualified appearance may still have defects such as being unable to be lit up. Therefore, the mass detection method cannot guarantee the product yield of Micro/Mini LEDs before mass transfer, and cannot guarantee that the Micro/Mini LEDs bonding to the driving circuit board can be lit up, which lead to a high repair ratio after mass transfer, and not only the transfer efficiency of the Micro/Mini LEDs is reduced, but also the actual mass production requirements cannot be met.

An exemplary embodiment of the present disclosure provides a detection substrate for mass detection of elements to be detected. In an exemplary implementation, a detection substrate includes a base substrate, the base substrate includes multiple through holes, and electrode columns are embedded in the multiple through holes; the base substrate includes a detection region and a bonding pad region, the detection region includes a driving circuit, and the bonding pad region is provided with bonding pads; and the bonding pads are connected with the electrode columns through the driving circuit.

Figure 1:
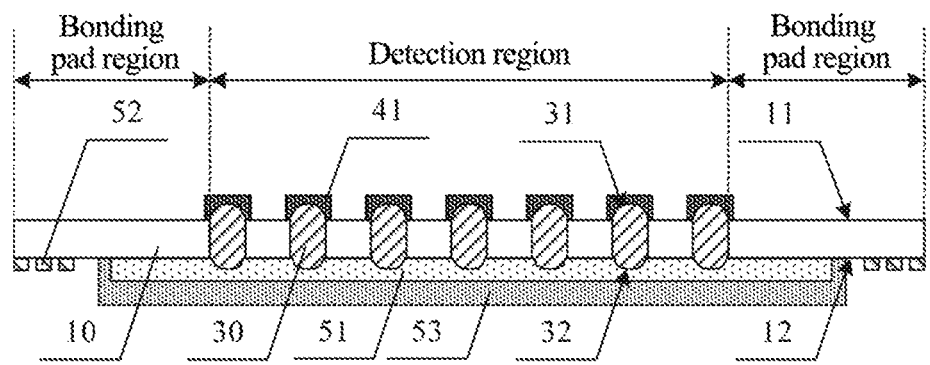
FIG. 1 is a schematic diagram of structure of a detection substrate according to an exemplary embodiment of the present disclosure.

FIG. 1 is a schematic diagram of structure of a detection substrate according to an exemplary embodiment of the present disclosure. As shown in FIG. 1, the detection substrate includes: a base substrate 10, multiple electrode columns 30, multiple conductive adhesive blocks 41, a driving circuit 51, and multiple bonding pads 52.

The base substrate 10 includes a detection region and a bonding pad region located at the periphery of the detection region. Multiple through holes regularly arranged are provided in the detection region of the base substrate 10. Meanwhile, the base substrate 10 has two surfaces facing away from each other: a first surface 11 and a second surface 12.

The multiple electrode columns 30 are embedded in the multiple through holes of the base substrate 10 respectively and protrude from the first surface 11 and the second surface 12 of the base substrate 10. On the first surface 11 of the base substrate 10, parts of the electrode columns 30 protruding from the first surface 11 form multiple first contacts 31. On the second surface 12 of the base substrate 10, parts of the electrode columns 30 protruding from the second surface 12 form multiple second contacts 32.

The multiple conductive adhesive blocks 41 are provided on the first surface 11 of the base substrate 10, each of the conductive adhesive blocks 41 covers one first contact 31 to form a conductive adhesive layer located in the detection region.

The driving circuit 51 is provided on the second surface 12 of the base substrate 10, and is located in the detection region. The driving circuit 51 is connected with the second contact 32 of each of the electrode columns 30.

The multiple bonding pads 52 are provided on the second surface 12 of the base substrate 10, and are located in the bonding pad region. The multiple bonding pads 52 are connected with the driving circuit 51.

In an exemplary embodiment, when massively detecting the elements to be detected, the bonding pads 52 are electrically connected with an external detection device, and the electrode columns 30 are electrically connected with the pins of the elements to be detected through the conductive adhesive blocks 41. The test signals output from the external detection device are transmitted to the elements to be detected through the bonding pads 52, the driving circuit 51, the electrode columns 30 and the conductive adhesive blocks 41. In an exemplary embodiment, the elements to be detected may be light emitting elements, such as light emitting diodes, and the light emitting diodes may include Micro LEDs or Mini LEDs.

In an exemplary embodiment, the driving circuit may include multiple gate lines and multiple data lines, the multiple gate lines and the multiple data lines vertically intersect to define multiple test units regularly arranged, at least one of the multiple test units are provided with a thin film transistor and an electrode column, the gate electrode of the thin film transistor is connected with the gate line, a first electrode of the thin film transistor is connected with the data line, and a second electrode of the thin film transistor is connected with the second contact of the electrode column. Or, the driving circuit includes a connection line, one end of the connection line is connected with the bonding pad, and the other end of the connection line is connected with the second contact of the electrode column.

In an exemplary embodiment, a seed layer may be provided on the side wall of each through hole of the base substrate.

In an exemplary embodiment, the second surface of the base substrate may be further provided with an encapsulation layer covering the driving circuit and the second contacts.

By forming the electrode columns, the driving circuit and the bonding pads on the base substrate, the detection substrate provided by an exemplary embodiment of the present disclosure realizes a lighting detection of massive light emitting elements before the mass transfer, which guarantees the product yield of the light emitting elements before the mass transfer, and reduces the repair ratio after the mass transfer.

The following is an exemplary explanation through a preparation process of the detection substrate. The "patterning process" mentioned in the present disclosure includes processes, such as film layer deposition, photoresist coating, mask exposure, development, etching, and photoresist stripping. Deposition may be implemented by any one or more of sputtering, evaporation and chemical vapor deposition, coating may be implemented by any one or more of spraying coating, spin coating and ink-jet printing, and etching may be implemented by any one or more of dry etching and wet etching, and these are not restricted in the present disclosure. "Thin film" refers to a layer of thin film fabricated by a certain material on a base substrate by using deposition or another process. If the "thin film" does not need a patterning process during the whole manufacturing process, the "thin film" can also be called a "layer". If the "thin film" needs a patterning process throughout the whole manufacturing process, it is referred to as a "thin film" before the patterning process and as a "layer" after the patterning process. The "layer" after the patterning process contains at least one "pattern". In an exemplary embodiment, an element to be detected takes a Micro LED as an example.

In an exemplary embodiment, the preparation process of the detection substrate includes the following operations.

Figure 2:
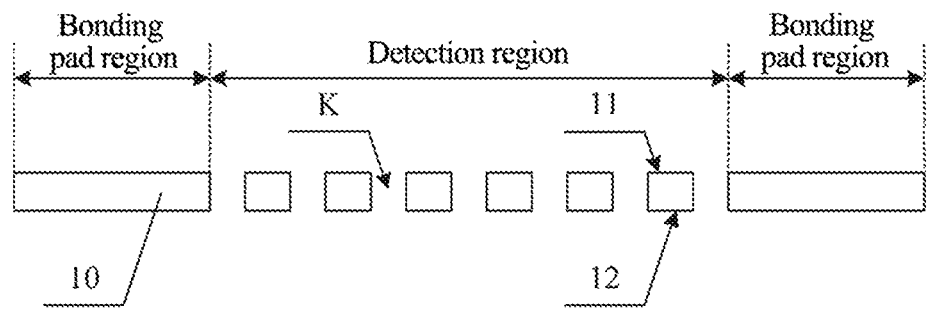
FIG. 2 is a schematic diagram of structure of a base substrate according to an exemplary embodiment of the present disclosure.

(1) A base substrate 10 is formed. In an exemplary embodiment, forming the base substrate 10 may include: in a plane parallel to the base substrate 10, the base substrate 10 includes a detection region and a bonding pad region located at the periphery of the detection region, and the detection region is provided with multiple through holes K regularly arranged. In a plane perpendicular to the base substrate 10, the base substrate 10 includes two surfaces facing away from each other: a first surface 11 and a second surface 12. During the detection, the first surface 11 serves as a detection surface (upper surface) opposite to the Micro LED to be detected, and the second surface 12 serves as a carrying surface (lower surface) opposite to the carrier substrate, and the multiple through holes K pass through the first surface 11 and the second surface 12 of the base substrate 10, as shown in FIG. 2. In an exemplary embodiment, the base substrate 10 may be made of hard materials such as glass. The glass may be the customized Through Glass Via (TGV), or an etching technology may be used to form multiple through holes on the glass, which will not be repeated in detail here. In an exemplary embodiment, the thickness of the base substrate may be about 150 microns to 200 microns. In a plane parallel to the base substrate, the cross-sectional shape of the through hole may be round, oval, rectangular or polygonal, and the distance between adjacent through holes can be set according to the spacing between pins of the elements to be detected. When the cross-sectional shape of the through hole is round, the diameter of the through hole may be of about 5 microns to 20 microns; when the cross-sectional shape of the through hole is polygonal, the diagonal line of the through hole may be of about 5 microns to 20 microns.

Figure 3:
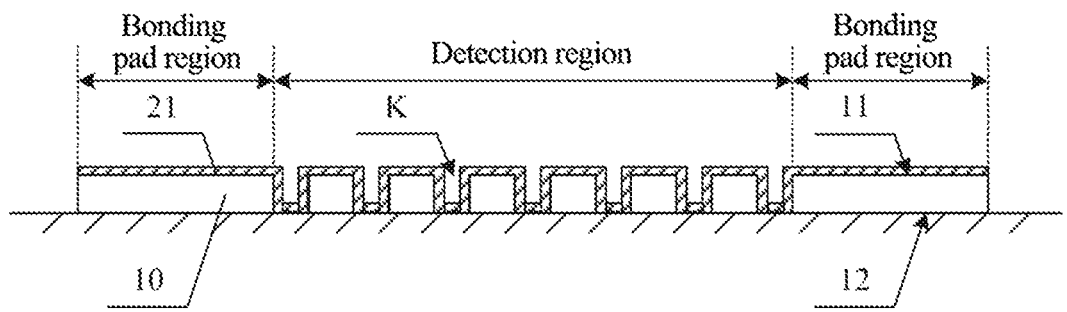
FIG. 3 is a schematic diagram of structure according to an exemplary embodiment of the present disclosure after a first metal thin film is deposited.
Figure 4:
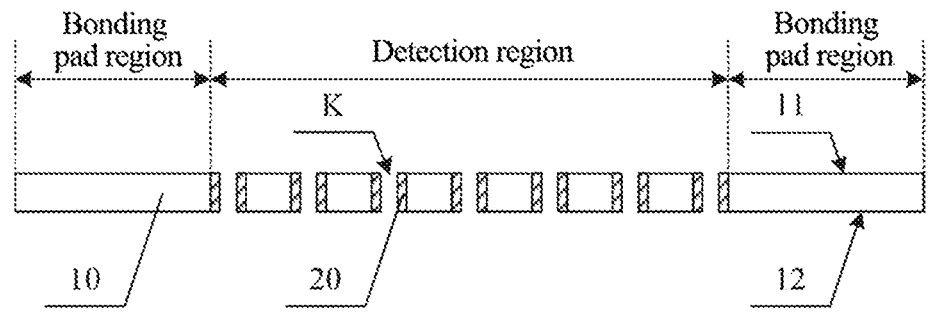
FIG. 4 is a schematic diagram of structure according to an exemplary embodiment of the present disclosure after a pattern of a seed layer is formed.

(2) A pattern of the seed layer 20 is formed. In an exemplary embodiment, forming the pattern of the seed layer 20 may include: providing the base substrate 10 on a machine platform, depositing a first metal thin film 21 on the first surface 11 of the base substrate 10 by sputtering, to form the first metal thin film 21 on the first surface 11 of the base substrate 10, the side wall of each of the multiple through holes K and the machine platform at the bottom of each of the multiple through holes K, as shown in FIG. 3. Then, the first metal thin film 21 is patterned by a patterning process, the first metal thin film on the first surface 11 is removed and the first metal thin film on the side wall of each of the multiple through holes K is retained. The base substrate 10 is removed from the machine platform to remove the first metal thin film on the machine platform, so as to form a pattern of the seed layer 20 on the side wall of each of the multiple through holes K, and the seed layer 20 has tubular structure, as shown in FIG. 4. In an exemplary embodiment, the first metal thin film may adopt metal materials, such as silver (Ag), copper (Cu), aluminum (Al), molybdenum (Mo), etc., and the thickness of the first metal thin film may be about 0.3 microns to 0.8 microns. In an exemplary embodiment, the first metal thin film may adopt copper (Cu) material.

Figure 5:
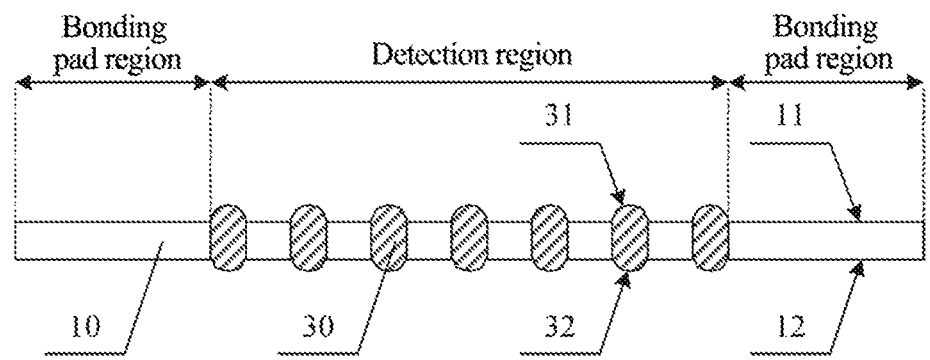
FIG. 5 is a schematic diagram of structure according to an exemplary embodiment of the present disclosure after patterns of the electrode columns are formed.

(3) Patterns of the electrode columns 30 are formed. In an exemplary embodiment, forming the patterns of the electrode columns 30 may include: on the base substrate 10 formed with the aforementioned patterns, the patterns of multiple electrode columns 30 are formed in the multiple through holes K of the base substrate 10 by using the seed layers 20 on the side walls of the multiple through holes K through an electroplating process. In an exemplary embodiment, the material used in the electroplating process and the material of the seed layer 20 may be the same or may be different. When the material used in the electroplating process is the same as that of the seed layer, the electrode column and the seed layer form an integrated column structure. When the material used in the electroplating process is different from that of the seed layer, the seed layer has tubular structure, the electrode column has column structure provided in the tubular seed layer, and the outer surface of the electrode column is closely attached to the inner surface of the seed layer to realize the connection between the electrode column and the seed layer. In an exemplary embodiment, by controlling the electroplating process parameters, each of the electrode columns 30 not only completely fills a through hole K, but also has a height greater than the thickness of the base substrate 10, so that each of the electrode columns 30 protrudes from both surfaces of the base substrate 10. That is to say, on the first surface 11 of the base substrate 10, the electrode columns 30 protrude beyond the first surface 11, forming the first contacts 31 on the first surface 11; on the second surface 12 of the base substrate 10, the electrode columns 30 protrude below the second surface 12, forming the second contacts 32 on the second surface 12, as shown in FIG. 5.

Figure 6:
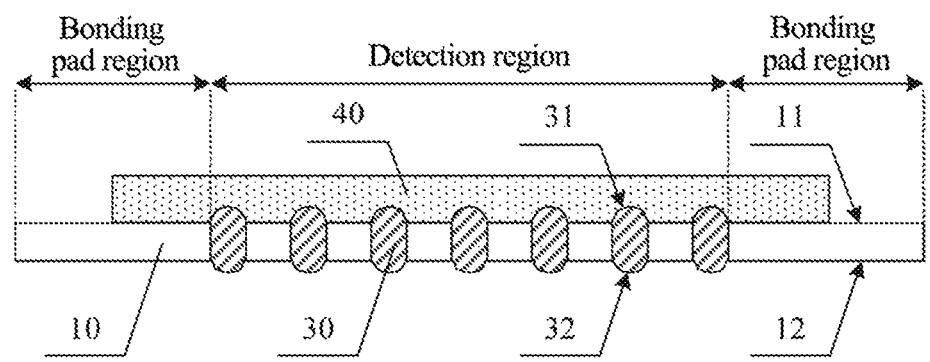
FIG. 6 is a schematic diagram of structure according to an exemplary embodiment of the present disclosure after a pattern of the protective layer is formed.

(4) A pattern of the protective layer 40 is formed. In an exemplary embodiment, forming a pattern of the protective layer 40 may include: on the base substrate 10 on which the aforementioned patterns are formed, coating a protective thin film on the side of the first surface 11 to form a pattern of the protective layer 40 covering multiple first contacts 31, as shown in FIG. 6. In an exemplary embodiment, the protective thin film may be made of a resin material. In an exemplary embodiment, the pattern of the protective layer 40 may be formed only in the detection region, or may be formed in the detection region and part of the bonding pad region, or may be formed on the entire base substrate 10. The pattern of the protective layer 40 formed on the first surface 11 is configured to protect multiple first contacts 31, so that the subsequent process will not affect the morphology and conductivity of the first contacts 31.

Figure 7:
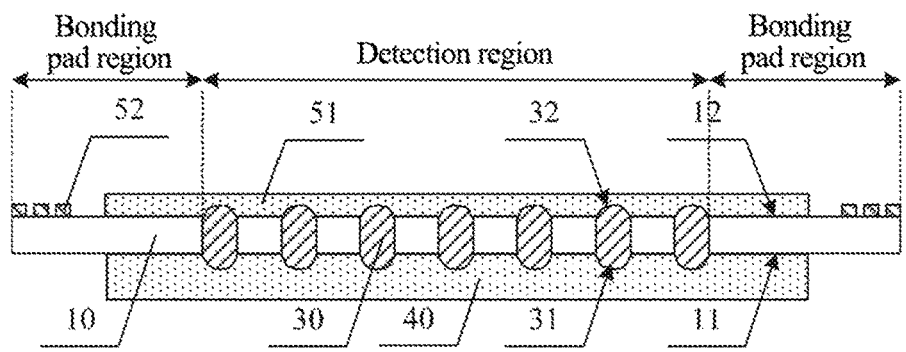
FIG. 7 is a schematic diagram of structure according to an exemplary embodiment of the present disclosure after patterns of a driving circuit and bonding pads are formed.
Figure 8:
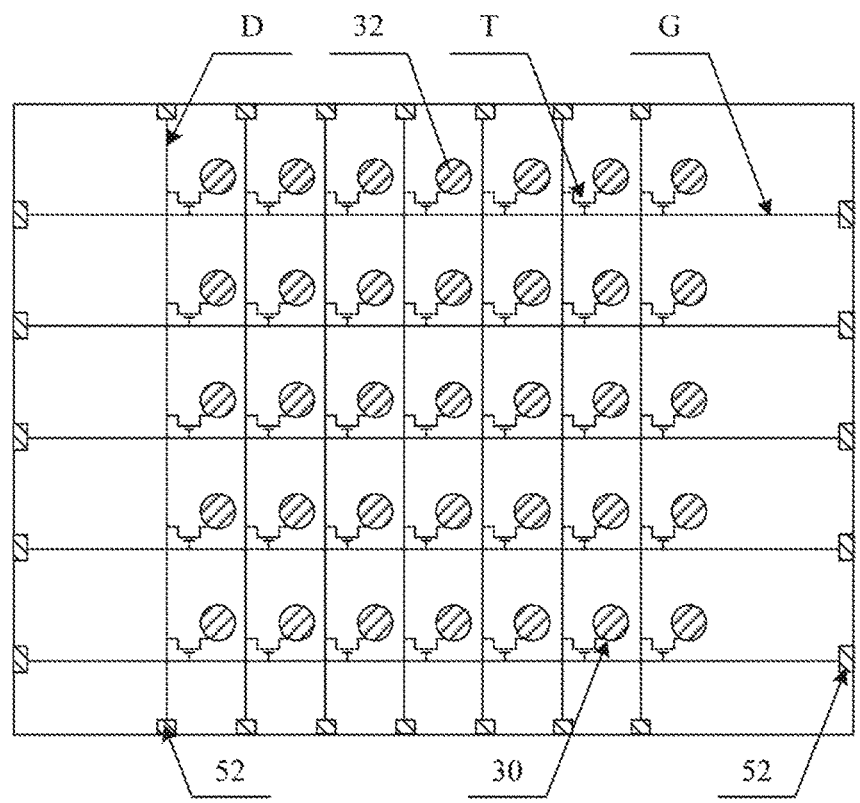
FIG. 8 is a schematic diagram of an equivalent circuit of a driving circuit and bonding pads in a detection substrate according to an exemplary embodiment of the present disclosure.
Figure 9:
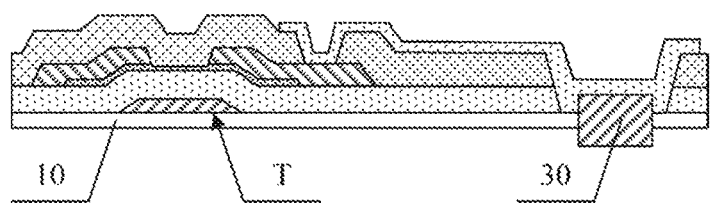
FIG. 9 is a schematic diagram of structure of a connection between a thin film transistor and an electrode column in a detection substrate according to an exemplary embodiment of the present disclosure.

(5) Patterns of a driving circuit 51 and the bonding pads 52 are formed. In an exemplary embodiment, forming the patterns of a driving circuit 51 and bonding pads 52 may include: first, turning over the aforementioned patterned substrate 10 so that the second surface 12 of the base substrate 10 faces upward; then, forming the patterns of a driving circuit 51 and multiple bonding pads 52 on the second surface 12 of the base substrate 10, as shown in FIG. 7. In an exemplary embodiment, the driving circuit 51 may be formed in the detection region, and multiple bonding pads 52 may be formed in the bonding pad region. The driving circuit 51 may include multiple gate lines and multiple data lines, the multiple gate lines and multiple data lines are connected with the multiple bonding pads 52 respectively. FIG. 8 is a schematic diagram of an equivalent circuit of a driving circuit and bonding pads in a detection substrate according to an exemplary embodiment of the present disclosure. As shown in FIG. 8, the driving circuit may include multiple gate lines G, multiple data lines D and multiple thin film transistors T (TFTs), the multiple gate lines G and the multiple data lines D vertically intersect to define multiple test units regularly arranged. The thin film transistors T and electrode columns are provided in each test unit. The gate electrodes of the thin film transistors T are connected with the gate lines G, the first electrodes (such as source electrodes) of the thin film transistors T are connected with the data lines D, the second electrodes (such as drain electrode) of the thin film transistor T are connected with the second contacts 32 of the electrode columns. In an exemplary embodiment, the structure of the patterns of the driving circuit 51 and bonding pads 52 may be similar to that of the liquid crystal display panel array substrate. FIG. 9 is a schematic diagram of a connection between a thin film transistor and an electrode column in a detection substrate according to an exemplary embodiment of the present disclosure. As shown in FIG. 9, the thin film transistor includes a gate electrode provided on a base substrate 10, a first insulating layer covering the gate electrode, an active layer provided on the first insulating layer, a second insulating layer covering the active layer, first electrodes and second electrodes provided on the second insulating layer, a third insulating layer covering the first electrodes and second electrodes, and connection electrodes provided on the third insulating layer, the connection electrodes are connected with the second electrodes and electrode columns 30 respectively through the via holes provided in the third insulating layer. In an exemplary embodiment, the process of forming the patterns of the driving circuit 51 and the bonding pads 52 may employ the process of preparing an array substrate. In an exemplary embodiment, the preparation process may include: by patterning process, forming patterns of gate lines and gate electrodes on the base substrate 10; forming a first insulating layer covering the gate lines and gate electrodes; by patterning process, forming an active layer on the first insulating layer, forming a second insulating layer covering the active layer; by patterning process, forming data lines, first electrodes (such as source electrodes) and second electrodes (such as drain electrodes) on the second insulating layer; by patterning process, forming a third insulating layer covering the first electrodes and the second electrodes, wherein the first via holes exposing the second electrodes and the second via holes exposing the second contacts of the electrode columns are provided in the third insulating layer; by patterning process, forming connection electrodes on the third insulating layer, wherein the connection electrodes are connected with the second electrodes through the first via holes on one hand, and connected with the electrode columns through the second via holes on the other hand. In an exemplary embodiment, while forming the gate lines and the data lines, multiple bonding pads are formed in the bonding pad region, and the multiple bonding pads are connected with the gate lines and the data lines, respectively.

Figure 10:
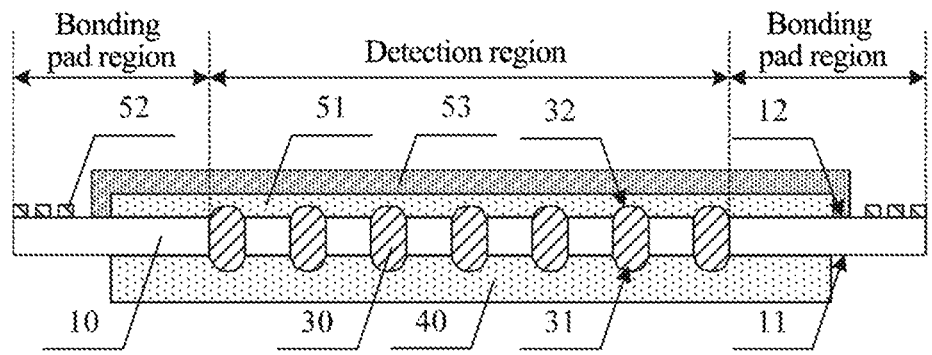
FIG. 10 is a schematic diagram of structure according to an exemplary embodiment of the present disclosure after a pattern of the encapsulation layer is formed.

(6) A pattern of the encapsulation layer 53 is formed. In an exemplary embodiment, forming the pattern of the encapsulation layer 53 may include: on the base substrate 10 on which the aforementioned patterns are formed, coating an encapsulation thin film on the second surface 12; forming a pattern of the encapsulation layer 53 covering the driving circuit 51 and the multiple second contacts 32 in the detection region by curing process, with the multiple bonding pads 52 in the bonding pad region being exposed, as shown in FIG. 10. In an exemplary embodiment, the encapsulation thin film may be made up of polyimide (PI), polyethylene terephthalate (PET) and other materials. In an exemplary embodiment, the pattern of the encapsulation layer 53 may be formed on the entire second surface 12 of the substrate 10, and the multiple bonding pads 52 in the bonding pad region are exposed through via holes.

(7) Patterns of the conductive adhesive blocks 41 are formed. In an exemplary embodiment, forming the patterns of the conductive adhesive blocks 41 may include: first, turning over the aforementioned patterned substrate 10 so that the first surface 11 of the base substrate 10 faces upward; then, removing the pattern of the protective layer 40 covering the multiple first contacts 31 by an ashing process to expose the multiple first contacts 31; and then, coating a layer of a conductive thin film on the first surface 11 of the base substrate 10, and forming a conductive adhesive layer on the first surface 11 of the base substrate 10 through masking, exposure and development processes. The conductive adhesive layer includes the patterns of the multiple conductive adhesive blocks 41, the positions of which correspond to the positions of the multiple electrode columns 30 one by one, and one conductive adhesive block 41 completely covers the first contact 31 of one electrode column 30, so that the first surface 11 of the base substrate 10 forms a detection surface of the detection substrate. In an exemplary embodiment, the material of the conductive thin film may be anisotropic conductive material. In an exemplary embodiment, the conductive thin film may be formed by brushing glue.

Through the above processes, the preparation of the detection substrate according to an exemplary embodiment of the present disclosure is completed. During the detection, the second surface 12 of the detection substrate forms a carrying surface, an external detection device is connected with the multiple bonding pads 52 in the bonding pad region of the second surface 12, and outputs a test signal independently to each of the electrode columns 30 through the bonding pads 52 and the driving circuit 51. The first surface 11 of the detection substrate forms a detection surface, the conductive adhesive blocks 41 are electrically connected with the electrodes of the Micro LEDs to be detected, and the test signal of each of the electrode columns 30 is output to the Micro LED to be detected through the conductive adhesive block 41, to light up the Micro LED.

According to an exemplary embodiment of the present disclosure, a detection substrate for performing lighting detection of massive Micro LEDs before the mass transfer, is formed through the electrode columns embedded in the base substrate, conductive adhesive provided on the surface of one side of the base substrate, a driving circuit and bonding pads provided on the surface of the other side of the base substrate, and the detection substrate has the advantages of simple structure, low cost, easy realization and the like. The detection substrate according to an exemplary embodiment of the present disclosure guarantees the product yield of the Micro LEDs before the mass transfer, and reduces the repair ratio after the mass transfer. Furthermore, the preparation of the detection substrate can employ mature process flow and mature process apparatus, with good process compatibility, high process realizability and strong practicability.

Figure 11:
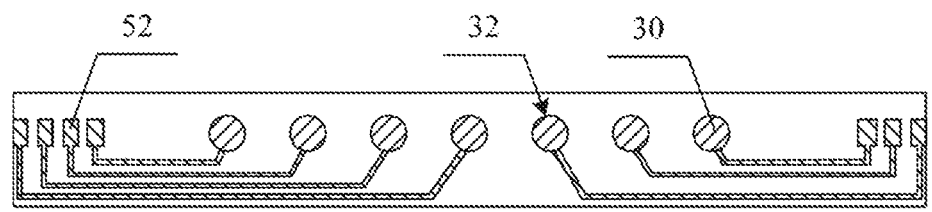
FIG. 11 is a schematic diagram of structure of a driving circuit and bonding pads in another detection substrate according to an exemplary embodiment of the present disclosure.

The detection substrate and the preparation process thereof described in an exemplary embodiment of the present disclosure are only examples. Therefore, the structure of the detection substrate can take other forms, and the flow of preparing the detection substrate can take other orders, which is not restricted here in the present disclosure. In an exemplary embodiment, a common electrode may be included in the driving circuit, and an electrode column and a common electrode are connected with the two pins of the Micro LED at the same time during detection. In an exemplary embodiment, the thin film transistors in the driving circuit may have a bottom gate structure or a top gate structure, and the active layer in the thin film transistors may employ various materials such as amorphous indium gallium zinc oxide (a-IGZO), zinc oxynitride (ZnON), indium zinc tin oxide (IZTO), amorphous silicon (a-Si), polysilicon (p-Si), hexathiophene, polythiophene, etc. In an exemplary embodiment, the driving circuit in the detection substrate can be simplified as a connection line form, and the process of forming patterns of the driving circuit and bonding pads may include: depositing a metal thin film on the second surface of the base substrate; patterning the metal thin film by a patterning process; and forming patterns of multiple connection lines and bonding pads on the second surface. The multiple connection lines are formed in the detection region and the bonding pads are formed in the bonding pad region. One end of each of the connection lines is connected with the second contact 32 of one electrode column 30 and the other end is connected with one bonding pad 52, as shown in FIG. 11. The bonding pads in the bonding pad region may realize the separate power-on control of each electrode column in the detection region through multiple connection lines.

Exemplary embodiments of the present disclosure further provide a detection device for mass detection of light emitting diodes. In an exemplary embodiment, the detection device includes a carrier substrate, a transfer apparatus, a control mechanism and an optical detection apparatus.

The carrier substrate is configured to carry the detection substrate.

The transfer apparatus is configured to transfer multiple elements to be detected to the detection substrate, pins of the elements to be detected are in direct contact with conductive adhesive blocks of the detection substrate.

The control mechanism is electrically connected with the bonding pads of the detection substrate and configured to provide electrical signals to the elements to be detected.

In an exemplary embodiment, the elements to be detected may be light emitting elements, such as light emitting diodes.

In an exemplary embodiment, the detection device may further includes an automated optical inspection apparatus, configured to collect images of multiple light emitting diodes, generate a lighting mapping, and determine the unlit light emitting diodes through the lighting mapping.

In an exemplary embodiment, the light emitting diodes include Micro LEDs or Mini LEDs.

The following is an exemplary description of a mass detection process of light emitting elements.

Figure 12:
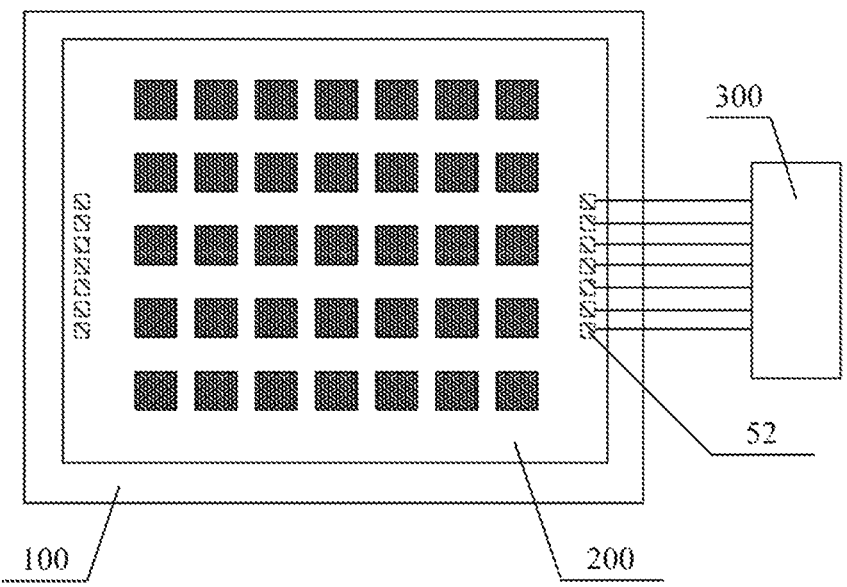
FIG. 12 is a schematic diagram of a detection substrate being provided on a carrier substrate according to an exemplary embodiment of the present disclosure.

(1) A detection substrate is provided on a carrier substrate. FIG. 12 is a schematic diagram of a detection substrate being provided on a carrier substrate according to an exemplary embodiment of the present disclosure. As shown in FIG. 12, before starting the mass detection, the detection substrate 200 is placed on a horizontally placed carrier substrate 100 first, and the carrier substrate 100 firmly adsorbs the detection substrate 200, and the multiple bonding pads 52 on the detection substrate 200 are electrically connected with the external detection device 300.

Figure 13:
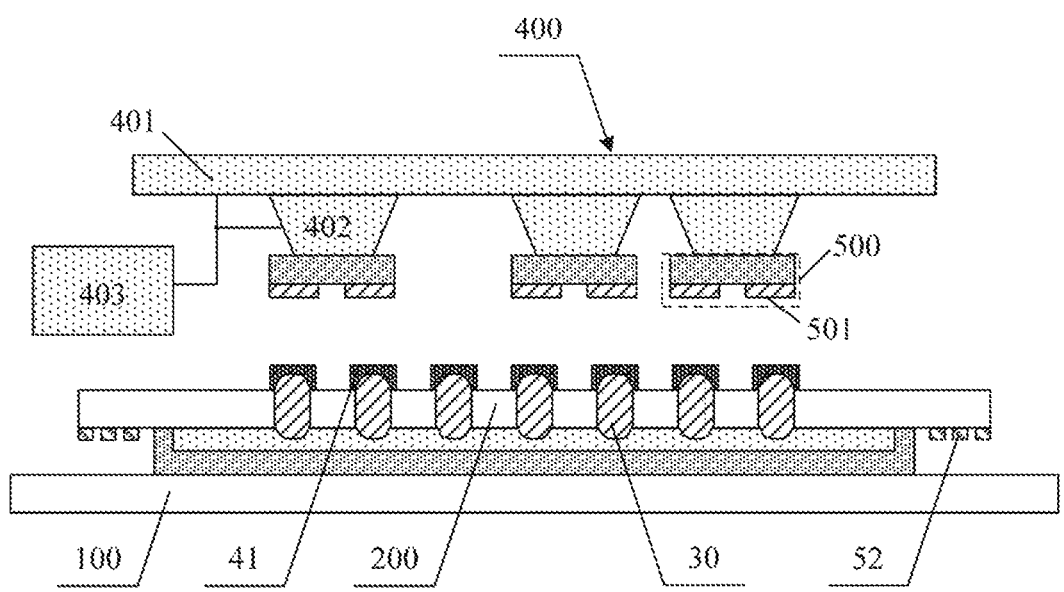
FIG. 13 is a schematic diagram of a transfer apparatus transferring light emitting elements according to an exemplary embodiment of the present disclosure.

(2) The transfer apparatus 400 adsorbs multiple light emitting elements, moves to be above the detection substrate 100, and is aligned. FIG. 13 is a schematic diagram of a transfer apparatus transferring light emitting elements according to an exemplary embodiment of the present disclosure. In an exemplary embodiment, the device and the way for adsorbing the light emitting elements 500 and aligning them with the detection substrate by the transfer apparatus 400 is basically the same as that for massively transferring the light emitting elements. The transfer apparatus 400 includes a transfer plate 401, transport heads 402 and a controller 403. The transport heads 402 are provided on the surface of the transfer plate 401, and each of the transport heads 402 is provided with array electrodes. The controller 403 is configured to provide a voltage to the array electrodes on the transport heads, to enable the array electrodes to be charged and to generate electrostatic force, to adsorb light emitting elements 500, while the controller 403 controls the transfer plate 401 to move to be above the detection substrate 200. The pins 501 of the adsorbed light emitting element 500 face to the detection substrate 200 below. The alignment starts when the transport heads 402 with the light emitting elements 500 adsorbed is away from the detection substrate 200 with a certain distance, and the positions of the light emitting elements 500 arranged on the transport heads 402 correspond to the positions of the electrode columns 30 arranged on the detection substrate one by one.

(3) After the alignment is completed, the external detection device 300 powers up the multiple electrode columns 30 of the detection substrate 200 separately through the multiple bonding pads and the driving circuit. The controller 403 controls the transport heads 402 to approach the detection substrate 200 gradually, and when the pins 501 of the light emitting elements 500 adsorbed on the transport heads 402 are in contact with the conductive adhesive blocks 41 at the ends of the electrode columns 30 on the detection substrate 200, the light emitting elements 500 are lit up. In an exemplary embodiment, the controller 403 can control the extent of pressing down and the accuracy of the alignment of the transport heads 402; the external detection device 300 controls to light up all light emitting elements, or light up the light emitting elements in a certain region, or light up a certain light emitting element; and the external detection device 300 can control the magnitude of the output current. In an exemplary embodiment, an Automated Optical Inspection (AOI) device collects images of the lit light emitting elements through a camera, generates a lighting mapping, identifies the lighting mapping, and determines the position(s) of the defective (unlit) light emitting element(s) for maintenance personnel to replace. After replacing a defective light emitting element(s), the power-on detection is conducted again. In an exemplary embodiment, the test signals output from the external detection device include row start signals output to the gate lines in the driving circuit and data signals output to the data lines in the driving circuit. After the row start signal controls the thin film transistors to be turned on, the data signals are output to the electrode columns through the thin film transistors. Two adjacent electrode columns of the detection substrate are respectively electrically connected with two pins of the light emitting elements, and the external detection device controls the lighting up of a light emitting element by outputting different data signals to the two pins of the light emitting element.

(4) When it is determined through the lighting mapping that all the light emitting elements may be lit, the conductive adhesive adhered to the pins of the light emitting elements can be removed by cleaning. Then the controller 403 controls the transfer plate 401 to move to be above the driving circuit board to be bound. After alignment, the light emitting elements on the transport heads 402 are bound to the driving circuit board, thus completing the mass transfer of the light emitting elements.

According to an exemplary embodiment of the present disclosure, mass detection of lighting up of light emitting elements is realized by introducing the detection substrate, thus ensuring that all of the massively transferred light emitting elements can be lit, which effectively guarantees the product yield of the massively transferred light emitting elements, and effectively reduces the repair ratio after the mass transfer. According to an exemplary embodiment of the present disclosure, an automated optical inspection apparatus is introduced, by using high-speed and high-precision vision processing technology, the unlit light emitting elements are detected through the lighting mapping, so that a real online optical detection is realized, detection efficiency is effectively improved, and detection quality is effectively guaranteed. According to an exemplary embodiment of the present disclosure, the detection method is simple, the detection time is short, and the detection precision is high, the detection efficiency and transfer efficiency of the light emitting elements are improved, the detection time and transfer time are shortened, the detection cost and transfer cost are reduced, and therefore, the requirement for actual mass production can be met.

In an exemplary embodiment, by adjusting the diameter of the through hole on the substrate, the test of light emitting elements of different specifications can be met, and by adjusting the spacing between the through holes on the substrate, the transport heads of different specifications can be matched. Cleaning and coating the anisotropic conductive adhesive by brushing glue can realize the reuse of the detection substrate. Therefore, the detection substrate in an exemplary embodiment of the present disclosure has advantages of simple structure, convenient use, low detection cost, high detection reliability and the like.

An exemplary embodiment of the present disclosure also provides a method for preparing a detection substrate, which is used for preparing a detection substrate for realizing mass detection of elements to be detected. In an exemplary embodiment, the method for preparing a detection substrate may include following steps.

In step S1, a base substrate including multiple through holes is provided, the base substrate includes a detection region and a bonding pad region.

In step S2, electrode columns are formed in the multiple through holes.

In step S3, a driving circuit is formed in the detection region, and bonding pads are formed in the bonding pad region, the bonding pads are connected with the electrode columns by the driving circuit.

In an exemplary embodiment, step S2 may include: depositing a metal thin film on the base substrate with the multiple through holes, and patterning the metal thin film by a patterning process to form a seed layer on a side wall of each of the multiple through holes; and forming the electrode columns in the multiple through holes by an electroplating process; wherein the electrode columns protrude from a first surface and a second surface of the base substrate respectively, forming first contacts on the first surface and second contacts on the second surface; the second surface is a surface opposite to the first surface.

In an exemplary embodiment, depositing the metal thin film on the base substrate with the multiple through holes, and patterning the metal thin film by a patterning process to form the seed layer on the side wall of each of the multiple through holes includes: providing the base substrate on a machine platform, depositing a metal thin film on the first surface of the base substrate, to form the metal thin film on the first surface of the base substrate, on the side walls of the multiple through holes and on the machine platform at the bottom of the multiple through holes; patterning the metal thin film by a patterning process, removing the metal thin film on the first surface and retaining the metal thin film on the side wall of each of the multiple through holes; and removing the base substrate from the machine platform to form the seed layer on the side wall of each of the multiple through holes, wherein the seed layer has tubular structure.

In an exemplary embodiment, the material of the seed layer is the same as that of the electrode column.

In an exemplary embodiment, step S3 may include: forming a driving circuit in the detection region on the second surface of the substrate, and forming bonding pads in the bonding pad region on the second surface of the substrate, wherein the bonding pads are connected with the second contacts of the electrode columns by the driving circuit.

In an exemplary embodiment, the driving circuit may include multiple gate lines and multiple data lines connected with the bonding pads, the multiple gate lines and the multiple data lines vertically intersect to define multiple test units, a thin film transistor is formed in the test unit, a gate electrode of the thin film transistor is connected with the gate line, a first electrode of the thin film transistor is connected with the data line, and a second electrode of the thin film transistor is connected with the second contact of the electrode column; or, the driving circuit may include connection lines, one end of the connection line is connected with the bonding pads, and the other end of the connection line is connected with the second contacts of the electrode columns.

In an exemplary embodiment, the method for preparing a the detection substrate may further include: forming a conductive adhesive layer on the first surface of the base substrate, the conductive adhesive layer includes multiple conductive adhesive blocks covering the first contacts.

An exemplary embodiment of the present disclosure provides a method for preparing a detection substrate, by forming the electrode columns, the driving circuit and the bonding pads on the base substrate, the method realizes a detection of mass elements to be detected before the mass transfer, which guarantees the product yield of the elements to be detected before the mass transfer, and reduces the repair ratio after the mass transfer. The preparation of the detection substrate can employ a mature process flow and a mature process apparatus, which has good process compatibility, high process realizability and strong practicability.

An exemplary embodiment of the present disclosure also provides a detection method, which employs the aforementioned detection device to realize the detection of massive elements to be detected. In an exemplary embodiment, the detection method may include: providing the detection substrate on a carrier substrate, wherein the bonding pads of the detection substrate are electrically connected with a control mechanism; transferring, by a transfer apparatus, multiple elements to be detected to the detection substrate, wherein pins of the multiple elements to be detected are in direct contact with conductive adhesive blocks of the detection substrate; and providing, by the control mechanism, an electrical signals to the elements to be detected.

In an exemplary embodiment, the elements to be detected may be light emitting elements, such as light emitting diodes.

The detection method may further include: collecting, by an automated optical inspection device, images of multiple light emitting diodes, generating a lighting mapping, and determining unlit light emitting diodes through the lighting mapping.

In an exemplary embodiment, the light emitting diodes may include Micro LEDs or Mini LEDs.

An exemplary embodiment of the present disclosure provides a detection method, by introducing a detection substrate, the method realizes mass detection of elements to be detected, effectively guarantees the product yield of the elements to be detected before the mass transfer, and effectively reduces the repair ratio after the mass transfer. An automated optical inspection apparatus is introduced, by using high-speed and high-precision vision processing technology, the elements to be detected are detected through the lighting mapping, so that a real online optical detection is realized, detection efficiency is effectively improved, and detection quality is effectively guaranteed.

In the description of the present disclosure, it need be understood that, an orientation or position relationship indicated by terms "middle", "upper", "lower", "front", "rear", "vertical", "horizontal", "top", "bottom", "inside", "outside", or the like is based on the orientation or position relationship shown in the drawings, and this is only for ease of description of the present disclosure and simplification of the description, rather than indicating or implying that the referred apparatus or element must have a specific orientation, or be constructed and operated in a particular orientation, and therefore this cannot be understood as a limitation on the present disclosure.

In the description of the present disclosure, it should be noted that unless otherwise explicitly specified and defined, terms "install", "communicate" and "connect" shall be understood broadly, for example, it may be fixedly connected, or may be removable connected, or may be integrally connected; it may be mechanically connected, or may be electrically connected; it may be directly connected, or may be indirectly connected through an intermediate medium, or it may be an internal connection of two elements. For those of ordinary skill in the art, the specific meanings of the above terms in the present disclosure may be understood according to a specific situation.

Although the embodiments disclosed in the present disclosure are as the above, the contents are only embodiments for facilitating understanding the present disclosure, rather than for restricting the present disclosure. Any person skilled in the field to which the present disclosure pertains may make any modifications and variations in the forms and

What we claim is:

1. A detection substrate, comprising a base substrate, the base substrate comprising a plurality of through holes, and electrode columns being embedded in the plurality of through holes; the base substrate comprising a detection region and a bonding pad region, the detection region comprising a driving circuit, and the bonding pad region being provided with bonding pads; and the bonding pads being connected with the electrode columns through the driving circuit;
 wherein the base substrate comprises a first surface and a second surface opposite to the first surface, and the electrode columns protrude from the first surface and the second surface respectively, forming first contacts on the first surface and second contacts on the second surface.

2. The detection substrate according to claim 1, wherein a conductive adhesive layer is provided on the first surface, and the conductive adhesive layer comprises a plurality of conductive adhesive blocks covering the first contacts.

3. The detection substrate according to claim 1, wherein the bonding pads and the driving circuit are provided on the second surface, and the bonding pads are connected with the second contacts of the electrode columns through the driving circuit.

4. The detection substrate according to claim 3, wherein the driving circuit comprises a plurality of gate lines and a plurality of data lines connected with the bonding pads, the plurality of gate lines and the plurality of data lines vertically intersect to define a plurality of test units, at least one of the plurality of the test units is provided with a thin film transistor, a gate electrode of the thin film transistor is connected with a gate line, a first electrode of the thin film transistor is connected with a data line, and a second electrode of the thin film transistor is connected with the second contact of an electrode column.

5. The detection substrate according to claim 3, wherein the driving circuit comprises connection lines, one end of a connection line is connected with the bonding pad, and another end of the connection line is connected with the second contact of an electrode column.

6. The detection substrate according to claim 3, wherein the second surface of the base substrate is further provided with an encapsulation layer covering the driving circuit and the second contacts.

7. The detection substrate according to claim 1, wherein a seed layer is provided on a side wall of each of the plurality of through holes, the seed layer has tubular structure, the electrode column has column structure provided in the seed layer, and an outer surface of the electrode column is closely attached to an inner surface of the seed layer.

8. The detection substrate according to claim 7, wherein a material of the seed layer is the same as that of the electrode column.

9. A detection device, comprising:
 a carrier substrate, configured to carry the detection substrate according to claim 1;
 a transfer apparatus, configured to transfer a plurality of elements to be detected to the detection substrate, wherein pins of the elements to be detected are in direct contact with conductive adhesive blocks of the detection substrate; and
 a control mechanism, electrically connected with bonding pads of the detection substrate and configured to provide electrical signals to the elements to be detected.

10. The detection device according to claim 9, wherein the elements to be detected are light emitting diodes; the detection device further comprises an automated optical inspection apparatus, configured to collect images of a plurality of light emitting diodes, generate a lighting mapping, and determine unlit light emitting diodes through the lighting mapping.

11. The detection device according to claim 10, wherein the light emitting diodes comprise mini light emitting diodes or micro light emitting diodes.

12. A detection method, comprising:
 providing the detection substrate according to claim 1 on a carrier substrate, wherein bonding pads of the detection substrate are electrically connected with a control mechanism;
 transferring, by a transfer apparatus, a plurality of elements to be detected to the detection substrate, wherein pins of the plurality of elements to be detected are in direct contact with conductive adhesive blocks of the detection substrate; and
 providing, by the control mechanism, electrical signals to the elements to be detected.

13. The detection method according to claim 12, wherein the elements to be detected are light emitting diodes; the detection method further comprises:
 collecting, by an automated optical inspection apparatus, images of a plurality of light emitting diodes, generating a lighting mapping, and determining unlit light emitting diodes through the lighting mapping.

14. The detecting method according to claim 13, wherein the light emitting diodes comprise mini light emitting diodes or micro light emitting diodes.

15. A method for preparing a detection substrate, comprising:
 providing a base substrate comprising a plurality of through holes, wherein the base substrate comprises a detection region and a bonding pad region;
 forming electrode columns in the plurality of through holes; and
 forming a driving circuit in the detection region, and forming bonding pads in the bonding pad region, wherein the bonding pads are connected with the electrode columns by the driving circuit;
 wherein forming the electrode columns in the plurality of through holes, comprises:
 depositing a metal thin film on the base substrate with the plurality of through holes, and patterning the metal thin film by a patterning process to form a seed layer on a side wall of each of the plurality of through holes;
 forming the electrode columns in the plurality of through holes by an electroplating process; wherein the electrode columns protrude from a first surface and a second surface of the base substrate respectively, forming first contacts on the first surface and second contacts on the second surface; the second surface is a surface opposite to the first surface.

16. The method according to claim 15, wherein depositing the metal thin film on the base substrate with the plurality of through holes, and patterning the metal thin film by a patterning process to form the seed layer on the side wall of each of the plurality of through holes, comprises:
 providing the base substrate on a machine platform, depositing a metal thin film on the first surface of the base substrate, to form the metal thin film on the first surface of the base substrate, on the side walls of the plurality of through holes and on the machine platform at a bottom of the plurality of through holes;

patterning the metal thin film by a patterning process, removing the metal thin film on the first surface and retaining the metal thin film on the side wall of each of the plurality of through holes; and removing the base substrate from the machine platform to form the seed layer on the side wall of each of the plurality of through holes, wherein the seed layer has tubular structure.

17. The method according to claim 15, wherein a material of the seed layer is the same as that of the electrode column.

\* \* \* \* \*